(12) United States Patent
Kamo et al.

(10) Patent No.: US 7,754,568 B2
(45) Date of Patent: Jul. 13, 2010

(54) SEMICONDUCTOR DEVICE AND METHOD OF FABRICATING THE SAME

(75) Inventors: Ryuichi Kamo, Yokkaichi (JP); Minori Kajimoto, Yokkaichi (JP); Hiroaki Tsunoda, Yokkaichi (JP); Yuuichiro Murahama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 67 days.

(21) Appl. No.: 12/131,406

(22) Filed: Jun. 2, 2008

(65) Prior Publication Data
US 2008/0305612 A1 Dec. 11, 2008

Related U.S. Application Data

(63) Continuation of application No. 11/158,074, filed on Jun. 22, 2005, now Pat. No. 7,381,641.

(30) Foreign Application Priority Data
Jun. 23, 2004 (JP) ............................. 2004-184948

(51) Int. Cl.
H01L 21/8234 (2006.01)
(52) U.S. Cl. ............... 438/275; 438/638; 257/E21.019
(58) Field of Classification Search .................. 438/638, 438/275; 257/E21.019
See application file for complete search history.

(56) References Cited

U.S. PATENT DOCUMENTS

| 6,110,842 | A | 8/2000 | Okuno et al. |
| 6,642,105 | B2 | 11/2003 | Kim et al. |
| 2005/0048723 | A1 | 3/2005 | Lee et al. |
| 2005/0118764 | A1 | 6/2005 | Chou et al. |

OTHER PUBLICATIONS

Wolf, S., Silicon Processing for the VLSI Era vol. 1: Process Technology, Lattice Press, pp. 666-667, 2000.

Primary Examiner—George Fourson
Assistant Examiner—John M Parker
(74) Attorney, Agent, or Firm—Oblon, Spivak, McClelland, Maier & Neustadt, L.L.P.

(57) ABSTRACT

A semiconductor device such as a flash memory includes a semiconductor substrate, two gate insulating films formed on the substrate so as to have a first film thickness and a second film thickness smaller than the first film thickness respectively, and a polycrystalline silicon film formed on the gate insulating films so that parts of the polycrystalline silicon film on the respective gate insulating films are on a level with each other and serving as a gate electrode. The substrate is formed with a recess defined by a bottom and sidewalls substantially perpendicular to the bottom, the recess corresponding to the part of the gate insulating film with the first film thickness.

3 Claims, 12 Drawing Sheets

FIG. 1A    FIG. 1B
FIG. 2A    FIG. 2B
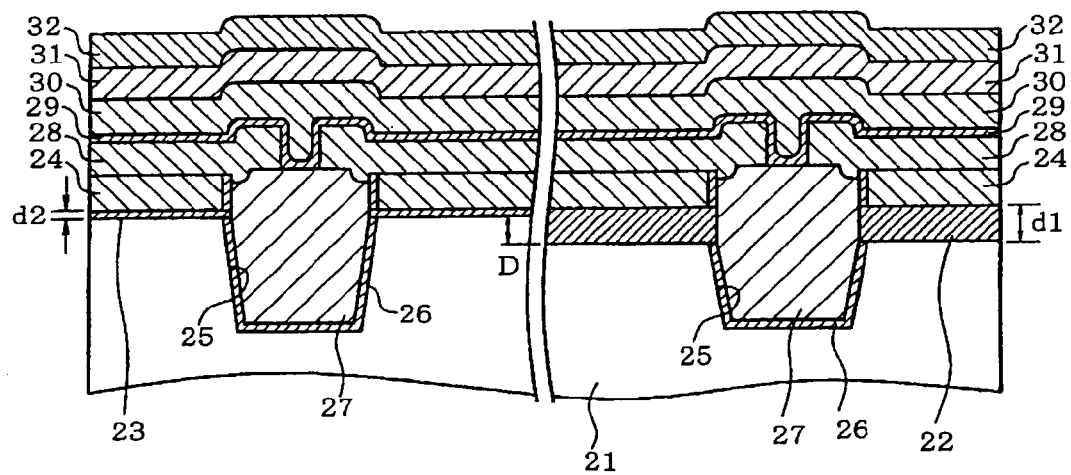
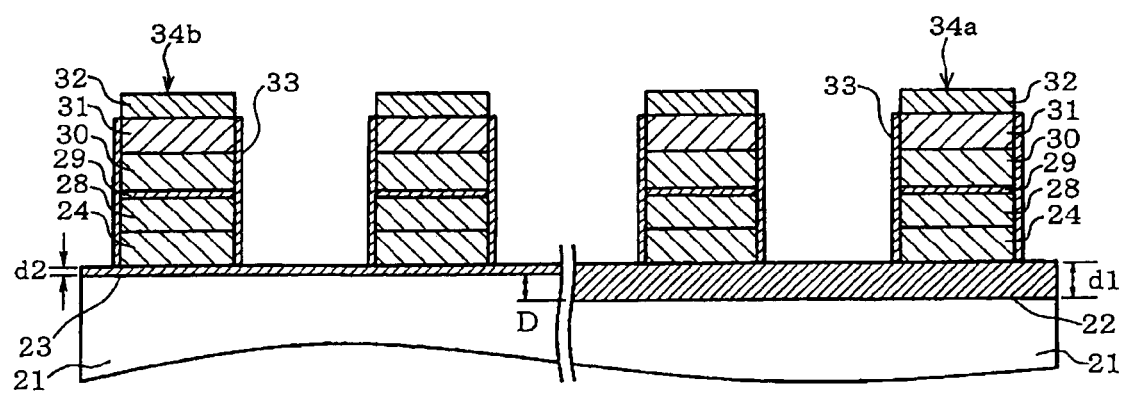

FIG.8A  FIG.8B
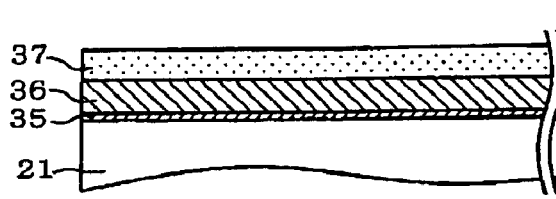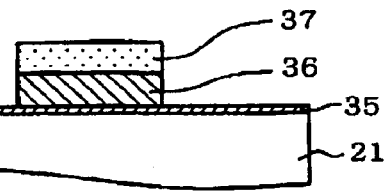
FIG.8C  FIG.8D
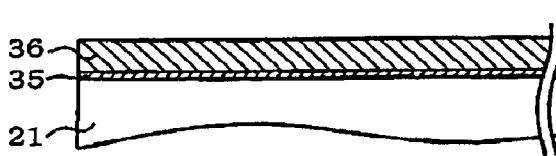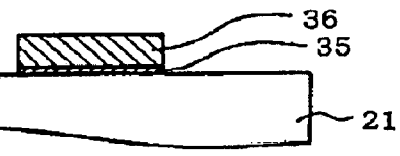
FIG.8E  FIG.8F
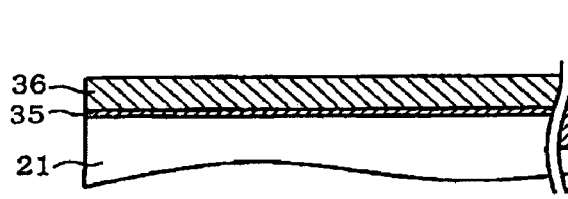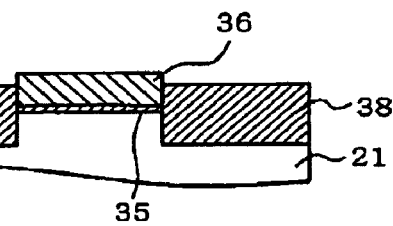
FIG.8G  FIG.8H
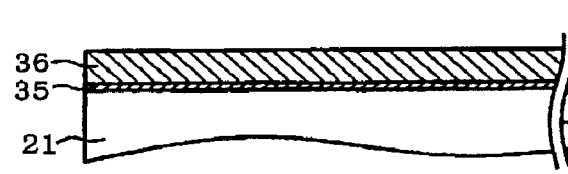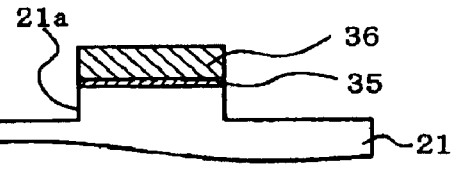

FIG. 8Q  FIG. 8R
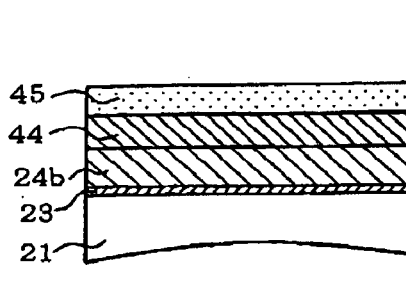
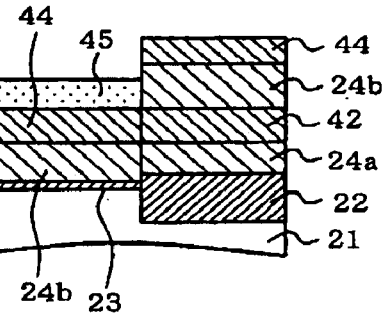
FIG. 8S  FIG. 8T
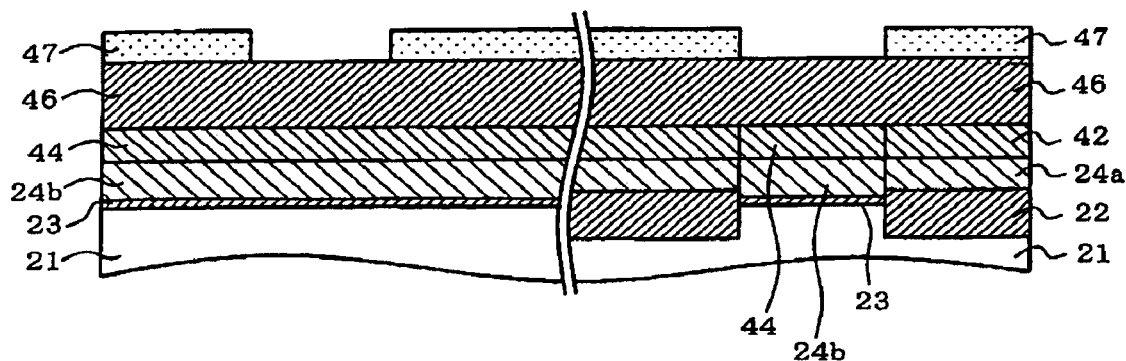
FIG. 8U  FIG. 8V
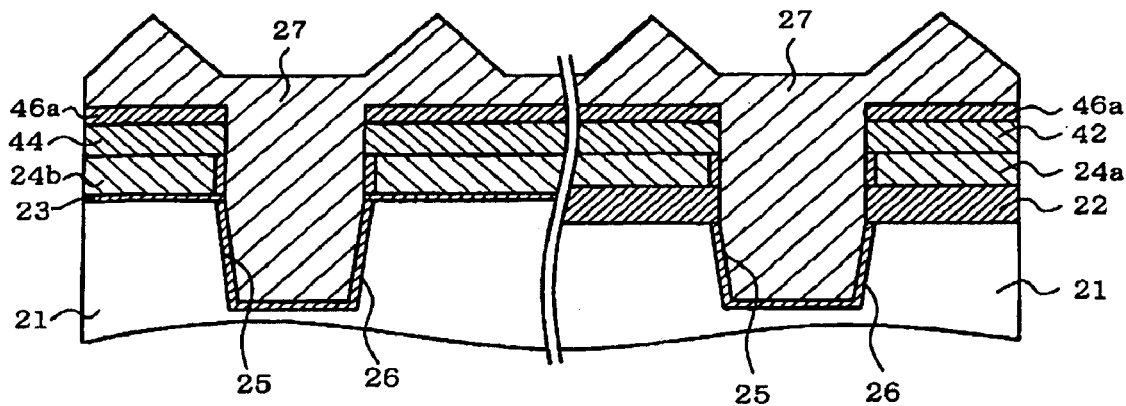

US 7,754,568 B2

SEMICONDUCTOR DEVICE AND METHOD OF FABRICATING THE SAME

CROSS-REFERENCE TO RELATED APPLICATIONS

This application is a continuation of U.S. application Ser. No. 11/158,074 filed Jun. 22, 2005, and is based on and claims the benefit of priority from the prior Japanese Patent Application No. 2004-184948, filed on Jun. 23, 2004, the entire contents of each of which are incorporated herein by reference.

BACKGROUND OF THE INVENTION

1. Field of the Invention

The present invention relates to a semiconductor device including a plurality of gate insulating films with different film thicknesses and a method of fabricating the same.

2. Description of the Related Art

Semiconductor devices of the above-noted type include non-volatile semiconductor devices such as a flash memory. The flash memory comprises a memory cell region and a peripheral circuit region both necessitating different gate breakdown voltages. Accordingly, gate insulating films having different film thicknesses corresponding to the different gate breakdown voltages respectively. In one of methods of fabricating semiconductor devices, a film structure of gate electrodes is formed first and subsequently, a structure of gate electrodes is formed together with formation of an element isolation region. When the gate insulating films have different film thicknesses in the aforesaid fabrication method, the following defect occurs: when a trench serving as shallow trench isolation (STI) is first formed and subsequently, an insulating film buried in the trench is planarized by a chemical mechanical polishing (CMP) process, the difference in the film thicknesses of gate insulating films results in differences in the level of a silicon nitride film serving as a stopper film in the CMP process. Accordingly, when polishing reaches part of the silicon nitride film at a lower side in the CMP process, part of the silicon nitride film is cut away to an abnormal extent corresponding to the level difference. As a result, an amount of process margin becomes smaller as the level difference in the silicon nitride film is increased. Furthermore, the level difference easily tends to result in discrepancies such as dishing in the CMP process.

To overcome the aforesaid discrepancies, U.S. Pat. No. 6,642,105B2 discloses a semiconductor device in which a thick oxide film is formed by a method of selective oxidation such as local oxidation of silicon (LOCOS) on a part where a gate oxide film with a larger film thickness is formed. The thick oxide film is etched so that a necessary film thickness is obtained, whereupon the difference due to the film thickness difference is reduced.

Thus, in the above-noted U.S. patent, in order that the difference in the film thickness of the gate oxide films may be resolved, a thick oxide film is formed by the selective oxidation on a part of the silicon substrate on which a thick gate oxide film is to be formed in a region where a thick gate oxide film is to be formed. The thick oxide film is etched so that a suitable film thickness is obtained, whereby a gate oxide film with a desired film thickness is formed. However, the method disclosed in the above-noted U.S. patent has the following disadvantage: an oxide film formed by the selective oxidation, namely, LOCOS, results in formation of a distorted region called "bird beak" formed in a peripheral edge of the oxide film. The distorted region cannot be used as contributing to the characteristic of the device. Consequently, the distorted region needs to be taken into consideration in the design of the semiconductor device, resulting in constraints to reduction I an area of the semiconductor device.

BRIEF SUMMARY OF THE INVENTION

Therefore, an object of the present invention is to provide a semiconductor device in which the difference in the level of the gate oxide films can be overcome so that a sufficient process margin can be ensured in the CMP process and processing achieving a high level of planarization can be carried out, and a method of fabricating such a semiconductor device.

The present invention provides a semiconductor device including a semiconductor substrate, two gate insulating films formed on the substrate so as to have a first film thickness and a second film thickness smaller than the first film thickness respectively, and a polycrystalline silicon film formed on the gate insulating films so that parts of the polycrystalline silicon film on the respective gate insulating films are on a level with each other and serving as a gate electrode, wherein the substrate is formed with a recess defined by a bottom and sidewalls substantially perpendicular to the bottom, the recess corresponding to the part of the gate insulating film with the first film thickness.

BRIEF DESCRIPTION OF THE DRAWINGS

Other objects, features and advantages of the present invention will become clear upon review of the following detailed description of the invention, with reference to the accompanying drawings, in which:

FIGS. 1A and 1B are diagrammatic longitudinal sections of a semiconductor device of one embodiment taken in a direction traversing shallow trench isolation (STI);

FIGS. 2A and 2B are diagrammatic longitudinal sections of an active region of the semiconductor device taken along the STI;

DETAILED DESCRIPTION OF THE INVENTION

Figure 3:
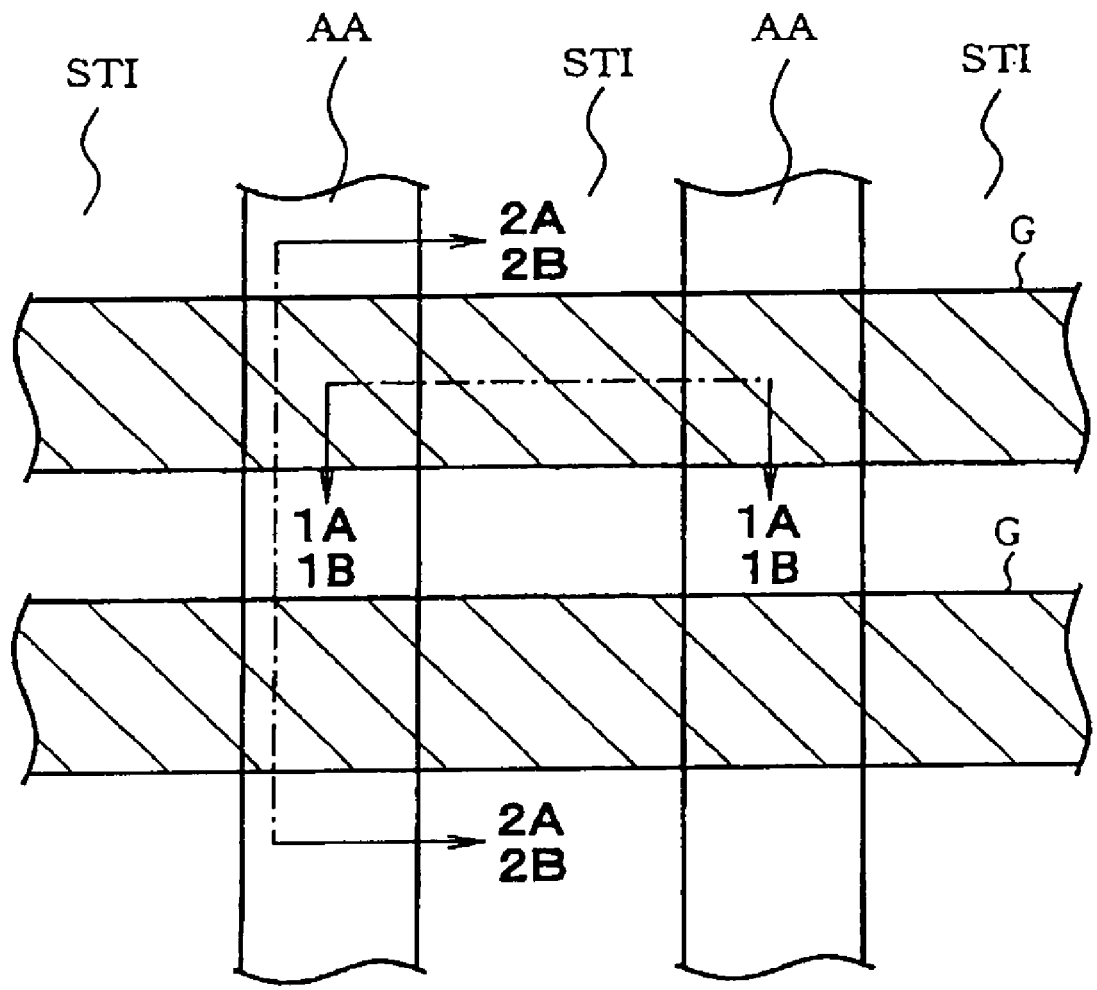
FIG. 3 is a diagrammatic plan view of transistors of a memory cell region and a peripheral circuit region.

A first embodiment of the present invention will be described with reference to FIGS. 1A to 5J. The invention is applied to a flash memory in the first embodiment. FIGS. 1A, 1B, 2A and 2B show layer structures of transistors formed in memory cell and peripheral circuit regions respectively. FIG. 3 is a diagrammatic plan view of portions corresponding to FIGS. 1A, 1B, 2A and 2B. FIGS. 1A and 1B are diagrammatic sections taken in the direction traversing an active area AA and shallow trench isolation (STI) on a gate electrode G, namely, along line 1A-1A (1B-1B) in FIG. 3. FIGS. 2A and 2B are diagrammatic sections taken in the direction parallel to the active area AA, namely, along line 2A-2A (2B-2B).

Referring to FIGS. 1A, 1B, 2A and 2B, a silicon substrate 21 serving as a semiconductor substrate has different thicknesses or a non-uniform thickness. In this case, a part of the substrate corresponding to a high breakdown voltage transistor of the peripheral circuit region has a smaller thickness by D (where D=27 nm, for example) than a part of the substrate corresponding to a cell transistor in the memory cell region.

Two gate oxide films 22 and 23 serving as gate insulating films with first and second film thicknesses respectively are formed on an upper surface of the silicon substrate 21 so as to correspond to the peripheral circuit and memory cell regions respectively. The gate oxide films 22 and 23 correspond to third and fourth silicon oxide films 22 and 23 in the fabrication process respectively. The gate oxide films 22 and 23 have film thicknesses d1=35 nm (the first film thickness) and d2=8 nm (the second film thickness) respectively. The relationship between the film thicknesses of the gate oxide films 22 and 23 is shown as follows:

$$d1 > d2$$

and moreover, the gate oxide films 22 and 23 are formed so that the following relationship is met:

$$d1 = d2 + D.$$

As described above, the thickness of the silicon substrate 21 is previously adjusted according to the film thicknesses d1 and d2 of the gate oxide films 22 and 23, whereupon the aforesaid equations are met. Consequently, the gate oxide films 22 and 23 have respective upper surfaces which are on a level with each other.

A first silicon polycrystalline film 24 is formed on the gate oxide films 22 and 23 and has a film thickness of 40 nm. An etching process is carried out at a surface of the first silicon polycrystalline film 24. Thus, the gate oxide films 22 and 23 are etched so that a trench 25 serving as shallow trench isolation (STI) is formed. A sixth silicon oxide film 26 is formed on an inner wall of the trench 25 and has a film thickness of 6 nm. A seventh silicon oxide film 27 is formed in the trench 25, whereby shallow trench isolation (STI) is formed. Active areas are separately formed at both sides of the STI respectively.

Upper surfaces of the active areas are planarized by the CMP process as will be described later. A second polycrystalline silicon film 28 constituting a control gate is formed on the upper surfaces of the active areas and has a film thickness of 60 nm. The second polycrystalline silicon film 28 is patterned so that slits are formed in an upper surface of the STI. An oxide-nitride-oxide (ONO) film 29 is formed on an upper surface of the second polycrystalline silicon film 28. The ONO film 29 is formed by stacking a silicon oxide film with a film thickness of 5.5 nm, a silicon nitride film with a film thickness of 8 nm and a silicon oxide film with a film thickness of 5.3 nm. The ONO film 29 serves as a gate insulating film disposed between a floating gate and a control gate of the memory cell transistor.

An etching process is carried out so that the floating gate and the control gate are separated as shown in FIGS. 2A and 2B, and thereafter, an eighth silicon oxide film 33 is formed on sidewalls. Thus, a gate electrode 34 is formed.

As the result of the above-described structure, the upper surfaces of the gate oxide films 22 and 23 having different film thicknesses are substantially on a level with each other. Accordingly, in a planarization process, a film serving as a stopper can be on the same level in a planarization process as will be described later. Consequently, a forming precision in the CMP process can be improved and a sufficient process margin can be ensured in the CMP process.

A fabrication process of the above-described semiconductor device will be described. FIGS. 4A to 4L show stages in the fabrication process corresponding to the sections as shown in FIGS. 1A and 1B. FIGS. 5A to 5J show stages in the fabrication process corresponding to the sections as shown in FIGS. 2A and 2B. In these figures, a left part shows a transistor in the memory cell region whereas a right part shows a high-voltage transistor in the peripheral circuit region.

Firstly, in FIGS. 4A, 4B, 5A and 5B, the silicon substrate 21 is heated in the atmosphere of $O_2$ at 800° C., so that the first silicon oxide film 35 with the film thickness of 20 nm is formed on the surface thereof. Subsequently, the first silicon nitride film 36 with a film thickness of 20 nm is deposited on the first silicon oxide film 35 by a low pressure CVD (LPCVD) process. The photoresist 37 is then patterned by a normal photolithography process. The first silicon nitride film 36 is etched with the resist pattern 37 serving as a mask.

Figures 4A, 4B:
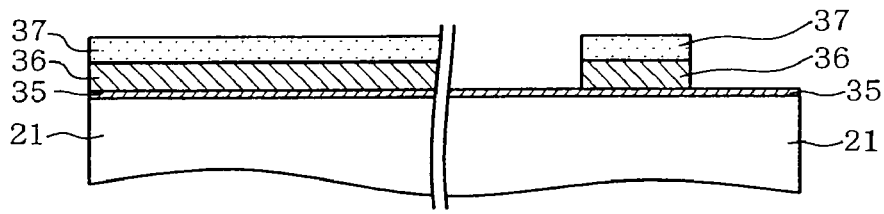
FIGS. 4A to 4N are longitudinal sections of the semiconductor device at respective stages of the fabrication process for the section corresponding to FIGS. 1A and 1B.
Figures 4C, 4D:
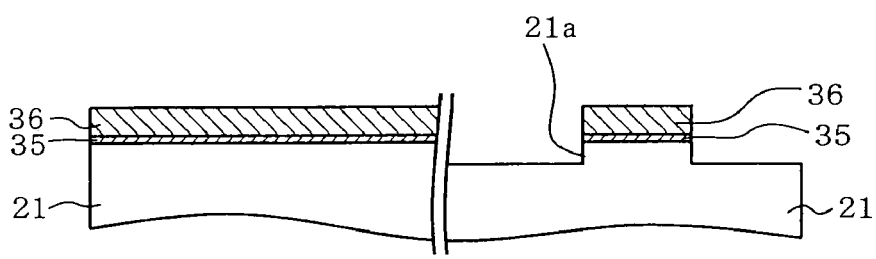

Subsequently, the silicon substrate 21 is exposed to $O_2$ plasma so that the photo resist 37 is removed as shown in FIGS. 4C and 4D. The first silicon oxide film 35 and the silicon substrate 21 are processed by the RIE process so that a recess 21a is formed. Subsequently, phosphating is carried out at 150° C. so that the first silicon nitride film 36 is removed. The first silicon oxide film 35 is etched 20 nm by a water solution of diluted hydrofluoric acid, whereupon the recess 21a is formed in the surface of the silicon substrate 21.

Figures 4E, 4F:
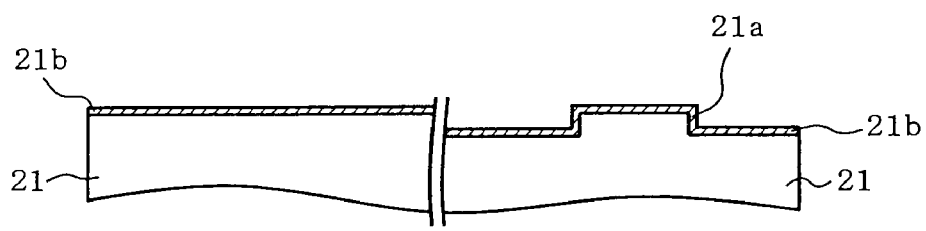

Subsequently, a silicon oxide film 21b is formed by thermal oxidation on the surface of the substrate 21 which has been exposed as the result of execution of the RIE process as shown in FIGS. 4E and 4F. The silicon oxide film 21b has a film thickness of about 10 nm, for example. Thereafter, the silicon oxide film 21b is removed by a wet etching process. As a result, a damaged layer formed on the surface of the substrate 21 exposed as the result of the RIE process can be removed.

Figures 4G, 4H:
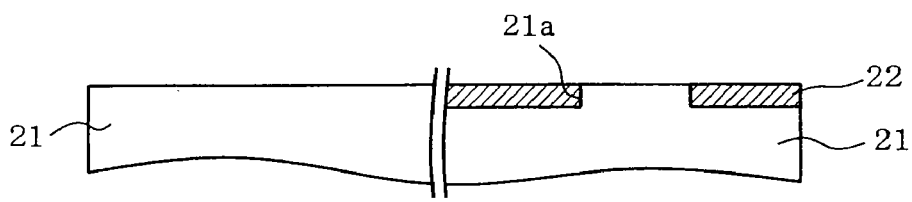
Figures 4I, 4J:
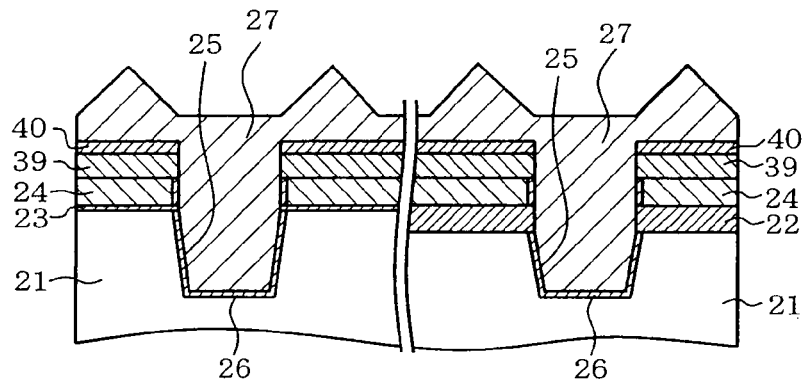
Figures 4K, 4L:
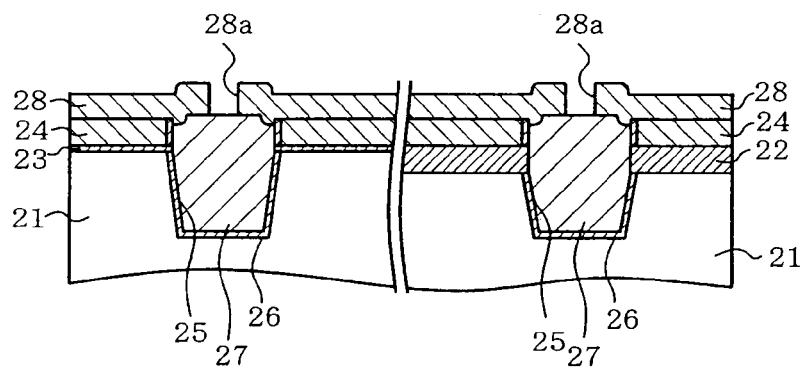
Figures 4M, 4N:
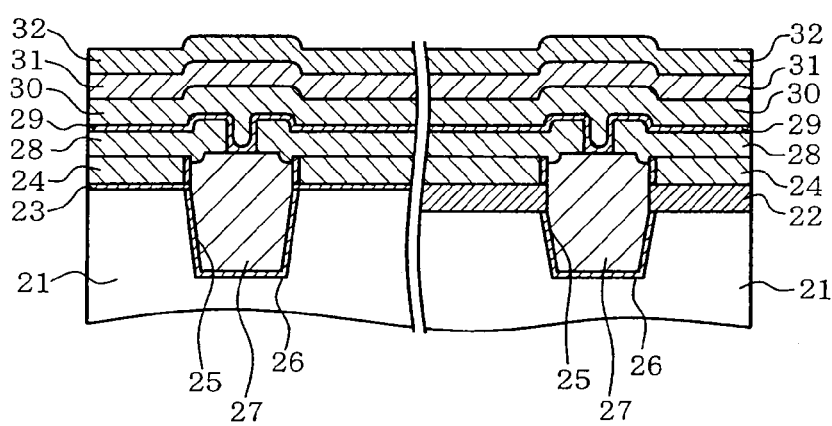

A third silicon oxide film 22 serving as a gate oxide film is formed so as to have a film thickness of 35 nm. A photoresist is processed into a predetermined pattern by a normal photolithography process. The third silicon oxide film 22 is immersed in a solution of buffered hydrofluoric acid for about 27 seconds with the patterned photoresist serving as a mask, thereby being removed. The silicon substrate 21 is then immersed in a mixture of sulfuric acid and a solution of hydrogen peroxide so that the photoresist is removed. As a result, the gate oxide film 23 is buried in the recess 21a of the silicon substrate 21 as shown in FIGS. 4G and 4H.

Subsequently, the substrate 21 is heated in the atmosphere of steam at 750° C. so that a fourth silicon oxide film 23 with a film thickness of 8 nm is formed. The LPCVD process is executed to sequentially deposit a first polycrystalline silicon film 24 with a thickness of 230 nm, a second silicon nitride film 39 with a film thickness of 90 nm and a fifth silicon oxide film. A photoresist is processed by the normal photolithography process into a desired pattern. The fifth silicon oxide film 40 is etched by the RIE process with the patterned photoresist serving as a mask. Thereafter, the silicon substrate 21 is exposed to $O_2$ plasma so that the photoresist is removed.

The second silicon nitride film 39 is then etched with the fifth silicon nitride film 40 serving as a mask, and successively, the first polycrystalline silicon film 24 is etched with the second silicon nitride film 39 serving as a mask. Thereafter, the third and fourth silicon films 22 and 23 and the substrate 21 are etched with the thick fifth silicon oxide film 40 serving as a mask, whereupon the trench 25 is formed in the silicon substrate 21. The substrate 21 is then heated in the $O_2$ atmosphere at 1000° C. so that a sixth silicon oxide film 26 with a film thickness of 6 nm is formed on an outer wall of the trench 25. Subsequently, a seventh silicon oxide film 27 with a film thickness of 550 nm is deposited on the outer wall of the HDP process so as to bury the trench 25. Consequently, the structure as shown in FIGS. 4I, 4J, 5C and 5D is obtained.

The seventh silicon oxide film 27 is planarized by the CMP process with the second silicon nitride film 39 serving as a stopper film. Thereafter, the seventh silicon oxide film 27 is heated in a nitride atmosphere at 900° C. The silicon substrate 21 is then immersed in a solution of buffered hydrofluoric acid for about 22 seconds for surface treatment, and thereafter, the second silicon nitride film 39 is removed by phosphating at 150° C. Subsequently, a second polycrystalline silicon film 28 to which phosphate has been added is deposited by the LPCVD process. The second polycrystalline silicon film 28 has a film thickness of 60 nm. The second polycrystalline silicon film 28 is then patterned into a photoresist. The substrate 21 is etched by the RIE process with the second polycrystalline silicon film 28 serving as a mask, whereupon a slit 28a is formed in an STI-forming part. Consequently, the structure as shown in FIGS. 4K, 4L, 5E and 5F is obtained.

Subsequently, as shown in FIGS. 4M, 4N, 5G and 5H, an ONO film 29 is deposited on the second polycrystalline silicon film 28. The ONO film 29 includes a silicon oxide film with a film thickness of 5.5 nm, a silicon nitride film with a film thickness of 8 nm and a silicon oxide film of 5.3 nm. The third polycrystalline silicon film 30 to which phosphor has been added is then deposited on the ONO film 29. The third polycrystalline silicon film 30 has a film thickness of 80 nm. A tungsten silicide (WSi) film 31 with a film thickness of 70 nm is deposited on the third polycrystalline silicon film 30, and a third silicon nitride film 32 with a film thickness of 300 nm is deposited on the WSi film 31.

Figures 5A, 5B:
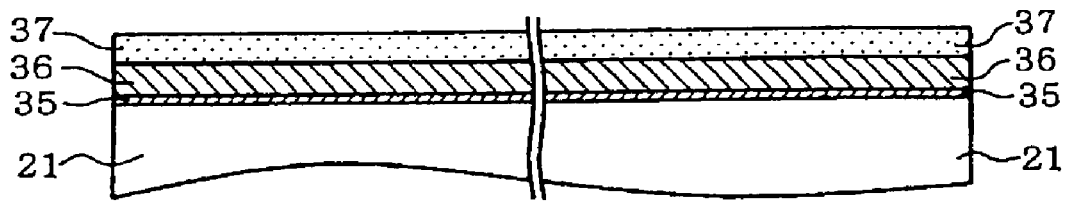
FIGS. 5A to 5J are longitudinal sections of the semiconductor device at respective stages of the fabrication process for the section corresponding to FIGS. 2A and 2B.
Figures 5C, 5D:
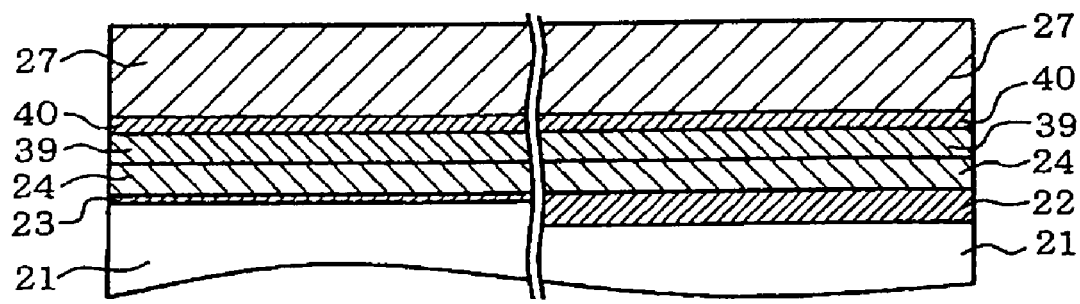
Figures 5E, 5F:
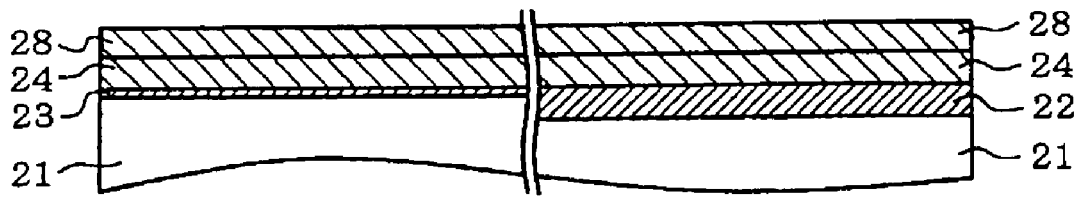
Figures 5G, 5H:
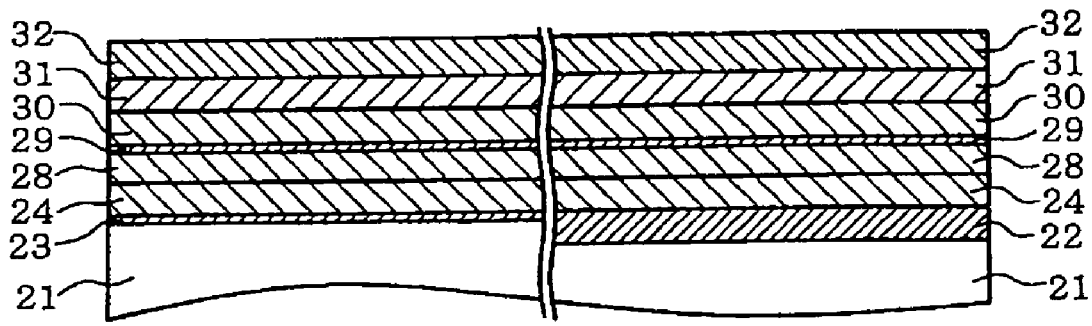
Figures 5I, 5J:
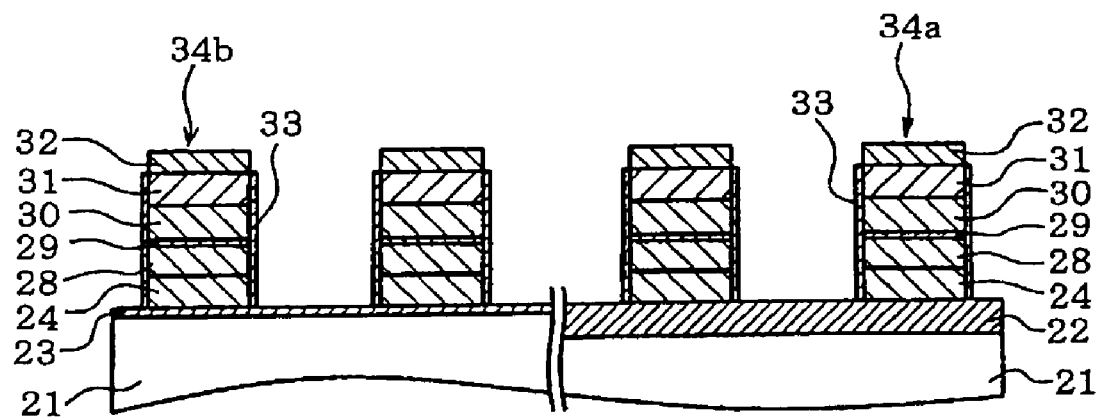

A photoresist is then patterned by the photolithography process into a predetermined configuration. The third silicon nitride film 32 is processed by the RIE with the patterned photoresist serving as a mask. The substrate 21 then exposed to $O_2$ plasma so that the photoresist is removed. Subsequently, as shown in FIGS. 5I and 5J, the etching process is carried out sequentially for the WSi film 31, the third polycrystalline silicon film 30, the ONO film 29, the second polycrystalline silicon film 28 and the first polycrystalline silicon film 24 with the third silicon nitride film 32 serving as a mask. The substrate 21 is then heated in the O2 atmosphere at 1000° C. so that a seventh silicon oxide film 33 is formed on sidewalls of the gate electrodes 34a and 34b. Consequently, a flash memory as shown in FIGS. 1A, 1B, 2A and 2B is obtained through the above-described fabrication steps.

According to the foregoing embodiment, when the gate oxide films 22 and 23 having different film thicknesses are formed by the foregoing fabrication steps, the recess 21 is previously formed in the silicon substrate 21 so as to correspond to a region in which a gate oxide film 22 with a larger film thickness is to be formed, whereupon the level difference is provided. Accordingly, the gage oxide films 22 and 23 are formed so that the upper surfaces of the films 22 and 23 are on a level with each other when the forming of the films 22 and 23 has been completed. Consequently, the level of the second silicon nitride film 39 becomes uniform in the CMP process. Thus, the planarity can be improved while a sufficient amount of process margin is obtained and accordingly, the flash memory can be processed precisely.

Furthermore, since the recess 21a is formed by the RIE process, the sidewalls are formed in the end of the recess 21a so as to be substantially vertical. Consequently, a damaged region such as containing a bird beak can be reduced as compared with the selective oxidation and accordingly, space saving can be achieved.

Furthermore, the recess 21a is formed in the silicon substrate 21 by the RIE process, and the silicon nitride film 36 and the silicon oxide film 35 are removed in the foregoing embodiment. Thereafter, a thin silicon oxide film 21b is formed by thermal oxidation and thereafter removed, whereupon the damaged layer resulting from the RIE process can be removed. Consequently, the reliability of the third silicon oxide film 22 serving as the gate oxide film can be improved.

The silicon nitride film 36 is deposited on the silicon oxide film 35 in FIGS. 4A, 4B, 5A and 5B in the foregoing embodiment. However, the silicon nitride film 36 may or may not be deposited. When no silicon nitride film 36 is formed, the step of removing the film 36 by the phosphating at 150° C. becomes unnecessary.

Figures 6A, 6B:
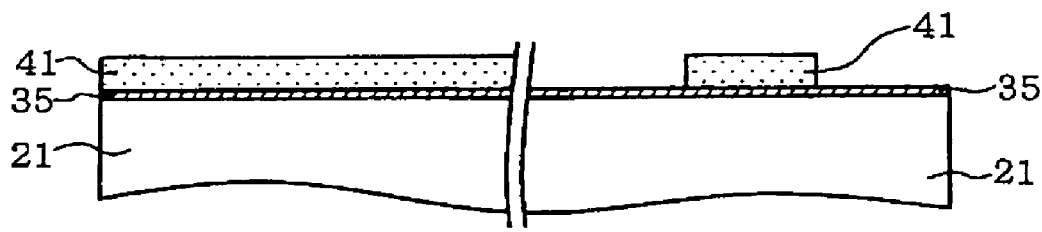
FIGS. 6A to 6F are longitudinal sections of the semiconductor device of a second embodiment at respective stages of the fabrication process for the section corresponding to FIGS. 1A and 1B.
Figures 6C, 6D:
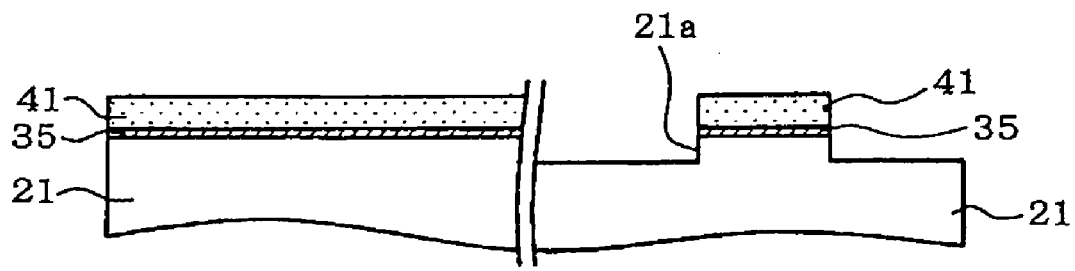

FIGS. 6A to 6F illustrate a second embodiment of the present invention. Only the difference between the first and second embodiments will be described. In the second embodiment, the first silicon nitride film 36 is not formed when the recess 21a is formed in the silicon substrate 21. More specifically, as shown in FIGS. 6A and 6B, the first silicon oxide film 35 with a film thickness of 20 nm is formed on the substrate 21 in the same manner as in the first embodiment. The normal photolithography process is carried out to form the photoresist 41 into the predetermined pattern. The first silicon oxide film 35 and substrate 21 are processed by the RIE process with the patterned photoresist 41 serving as a mask, so that the recess 21a is formed, as shown in FIGS. 6C and 6D.

Figures 6E, 6F:
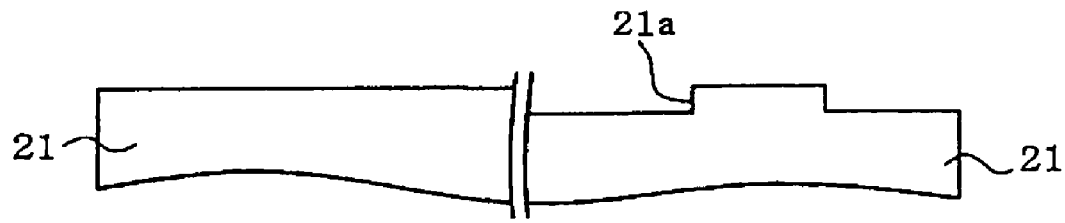

Subsequently, the substrate 21 is exposed to $O_2$ plasma so that the photoresist 41 is removed, as shown in FIGS. 6E and 6F. As a result, the recess 21a is formed in the substrate 21. Subsequently, the same processes are executed as in the first embodiment such that the same flash memory as that of the first embodiment can be fabricated with the same operation and effect. Furthermore, the production cost can be reduced since the fabrication method of the second embodiment is carried out without provision of the first silicon nitride film 36.

Figures 7A, 7B:
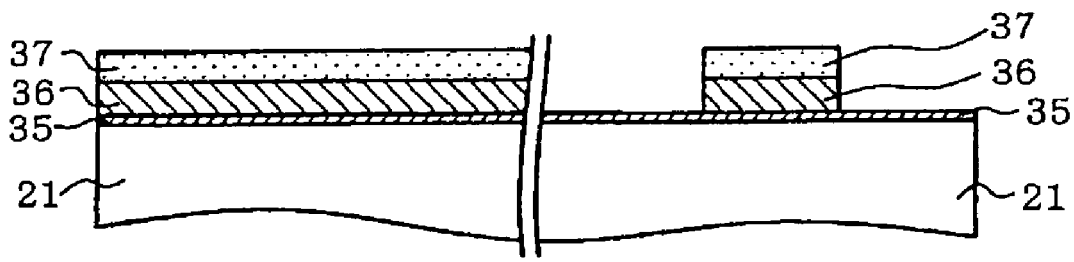
FIGS. 7A to 7F are longitudinal sections of the semiconductor device of a third embodiment at respective stages of the fabrication process for the section corresponding to FIGS. 1A and 1B.
Figures 7C, 7D:
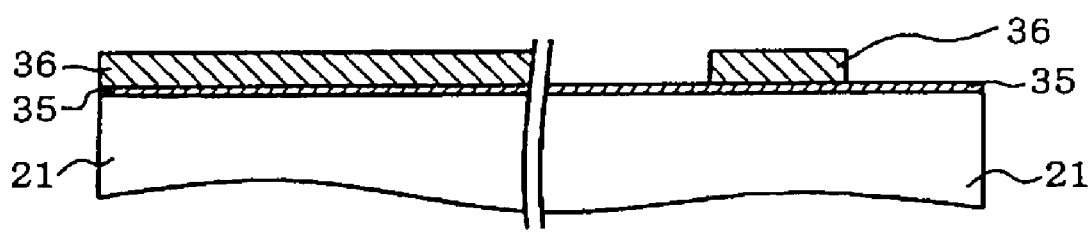
Figures 7E, 7F:
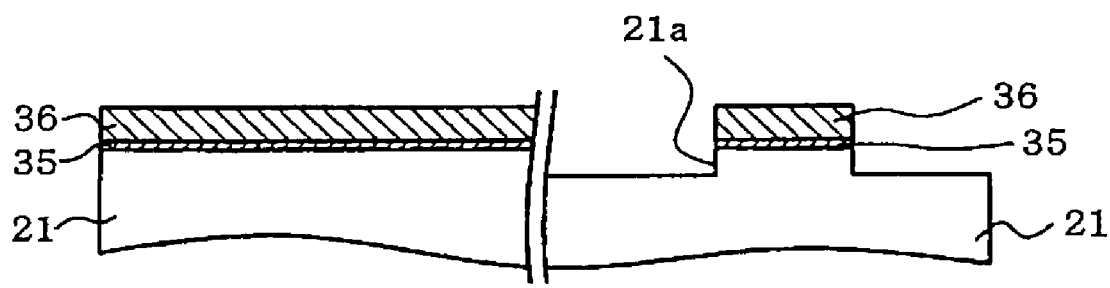

FIGS. 7A to 7F illustrate a third embodiment of the invention. Only the difference between the first and third embodiments will be described. In the third embodiment, the normal photolithography process is carried out to form the photoresist 37 into the predetermined pattern. The first silicon nitride film 36 is removed with the patterned photoresist 37 serving as the mask, as shown in FIGS. 7A and 7B. Thereafter, the silicon substrate 21 is exposed to $O_2$ plasma so that the photoresist 37 is removed, as shown in FIGS. 7C and 7D. Subsequently, the first silicon oxide film 35 and the silicon nitride film 36 are processed so that the recess 21a is formed, as shown in FIGS. 7E and 7F.

The first silicon nitride film 36 is then removed by the phosphating at 150° C. and the first silicon oxide film 35 is etched 20 nm by the diluted hydrofluoric acid. Thereafter, the third silicon oxide film 22 serving as the gate oxide film is formed so as to have a film thickness of 35 nm. Subsequently, the same processes are executed as in the first embodiment. Thus since the recess 21a is formed in the substrate 21 in the manner as described above, the same flash memory as that of the first embodiment can be fabricated with the same operation and effect.

FIGS. 8A to 8Z and 9A to 9J illustrate a fourth embodiment of the invention. Describing the difference between the first and fourth embodiments, in addition to the provision of the recess 21a in the substrate 21, the thickness of the first polycrystalline silicon film 24 is adjusted such that the upper surfaces of the gate oxide films 22 and 23 can be formed so as to be on a level with each other.

FIGS. 8Y and 8Z, and 9G and 9H correspond to FIGS. 1A and 1B to which reference has been made in the description of the first embodiment, respectively. FIGS. 8Y and 8Z, and 9G and 9H illustrate layer structures of the transistors in the memory cell and peripheral circuit regions respectively. The silicon substrate 21 serving as the semiconductor substrate has different thicknesses or a non-uniform thickness. In this case, a part of a high breakdown voltage transistor in the peripheral circuit region is formed so as to have a smaller thickness than a part of a cell transistor by a thickness dimension Da (differential dimension).

The gate oxide films 22 and 23 serving as gate insulating films are formed on the upper surface of the substrate 21 so as to correspond to the peripheral circuit and memory cell regions respectively. The gate oxide films 22 and 23 have film thicknesses d1=35 nm and d2=8 nm respectively. The thicker gate oxide film 22 has an upper surface which is located higher than the thinner gate oxide film 23. As described above, the relationship between the film thicknesses of the gate oxide films 22 and 23 is shown as follows:

$$d1 > d2$$

and moreover, when the relationship between the film thicknesses includes the difference Da, $$d1 = d2 + Da.$$

This relationship denotes that the difference has not been resolved.

On the other hand, the first polycrystalline silicon films 24a and 24b formed on the upper surfaces of the gate oxide films 22 and 23 have film thicknesses s1 and s2 respectively. The relationship between the film thicknesses s1 and s2 is shown as follows:

$$s1 < s2$$

The aforesaid relation is shown as follows when the thicknesses s1 and s2 are included:

$$d1 + s1 = d2 + s2 + Da$$

More specifically, the thickness of the silicon substrate 21 is previously adjusted by dimension Da as described above and furthermore, the thicknesses s1 and s2 of the first polycrystalline silicon films 24a and 24b are adjusted so as to meet the aforesaid relation, so that the upper surfaces of the first polycrystalline silicon films 24a and 24b are on a level with each other. Since the structure of an upper surface side of the substrate is the same as described in the first embodiment, the description of the structure is eliminated.

Even when the difference between the film thicknesses of the gate oxide films 22 and 23 cannot be absorbed by the recess 21a formed in the substrate 21, the film thicknesses of the first polycrystalline silicon films 24a and 24b are adjusted to third and fourth film thicknesses respectively so that the upper surfaces of the first polycrystalline silicon films 24a and 24b are on a level with each other. Consequently, since the level of the film serving as a stopper becomes uniform in a planarization process, the forming accuracy can be improved and a sufficient process margin can be ensured.

A fabrication process of the above-described semiconductor device will be described. FIGS. 8A to 8Z show stages in the fabrication process corresponding to the sections as shown in FIGS. 1A and 1B. FIGS. 9A to 9J show stages in the fabrication process corresponding to the sections as shown in FIGS. 2A and 2B. In these figures, a left part shows a transistor in the memory cell region whereas a right part shows a high-voltage transistor in the peripheral circuit region.

Firstly, in FIGS. 8A, 8B, 9A and 9B, the silicon substrate 21 is heated in the atmosphere of $O_2$ at 800° C., so that the first silicon oxide film 35 with the film thickness of 20 nm is formed on the surface thereof. Subsequently, the first silicon nitride film 36 with a film thickness of 90 nm is deposited on the first silicon oxide film 35 by a low pressure CVD (LPCVD) process. The photoresist 37 is then patterned by a normal photolithography process. The first silicon nitride film 36 is etched by the RIE process with the resist pattern 37 serving as a mask.

Subsequently, the silicon substrate 21 is exposed to $O_2$ plasma so that the photo resist 37 is removed as shown in FIGS. 8C and 8D. The first silicon oxide film 35 is immersed in a solution of buffered hydrofluoric acid for about 30 seconds with the first silicon nitride film 36 with a film thickness of 90 nm serving as a mask, thereby being etched by 20 nm.

The second silicon oxide film 38 with a film thickness of 100 nm is formed as shown in FIGS. 8E and 8F. The second silicon oxide film 38 is then immersed in a solution of buffered hydrofluoric acid for about 90 seconds with the first silicon nitride film 36 with a film thickness of 90 nm serving as a mask, thereby being etched by 20 nm, thereby being removed, as shown in FIGS. 8G and 8H.

Figures 8I, 8J:
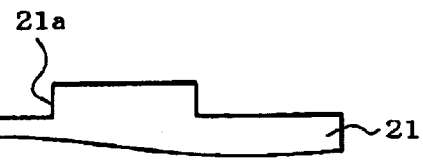
FIGS. 8A to 8V are longitudinal sections of the semiconductor device of a fourth embodiment at respective stages of the fabrication process for the section corresponding to FIGS. 1A and 1B.

Subsequently, phosphating is carried out at 150° C. so that the first silicon nitride film 36 is removed as shown in FIGS. 8I and 8J. The first silicon oxide film 35 is etched 20 nm by a solution of diluted hydrofluoric acid. As a result, the surface of the silicon substrate 21 is exposed and the recess 21a with a depth Da is formed in a predetermined portion of the surface thereof.

Figures 8K, 8L:
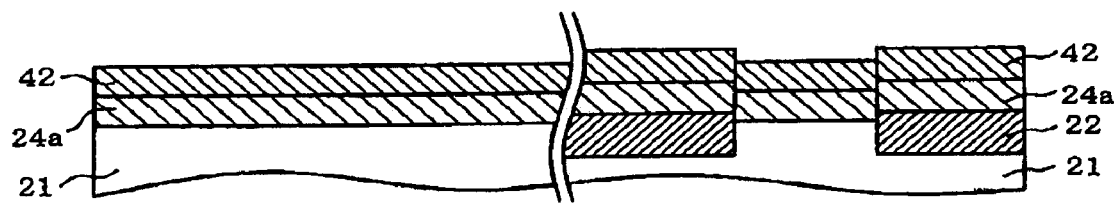
Figures 8M, 8N:
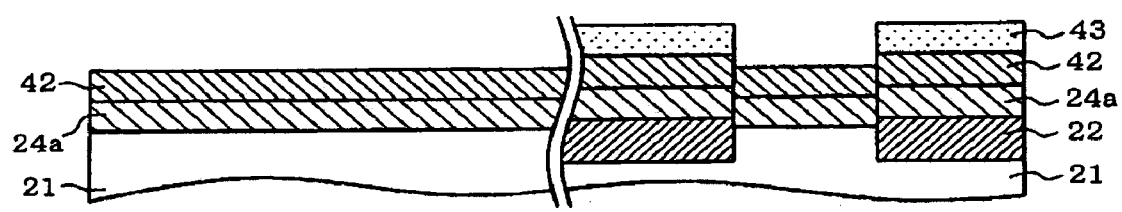
Figures 8O, 8P:
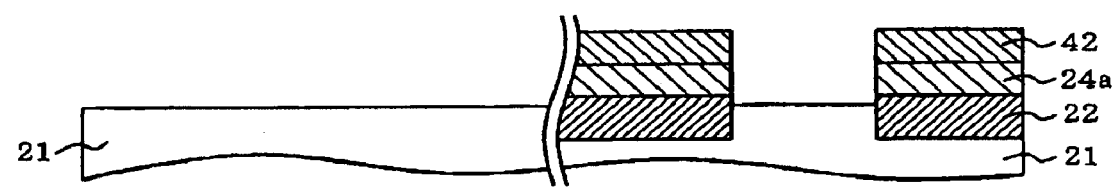
Figures 9A, 9B:
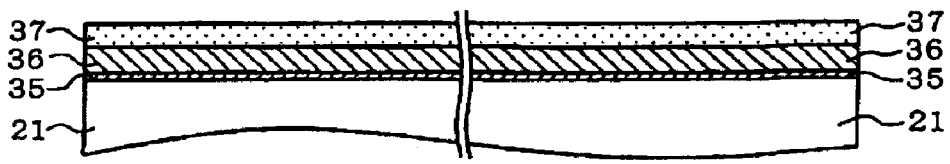
FIGS. 9A to 9J are longitudinal sections of the semiconductor device of a second embodiment at respective stages of the fabrication process for the section corresponding to FIGS. 2A and 2B.
Figures 9C, 9D:
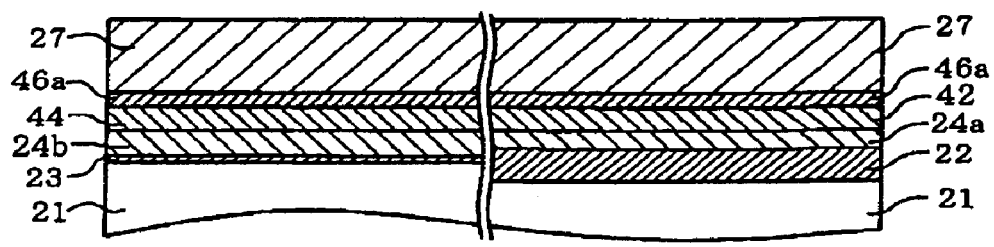
Figures 9E, 9F:
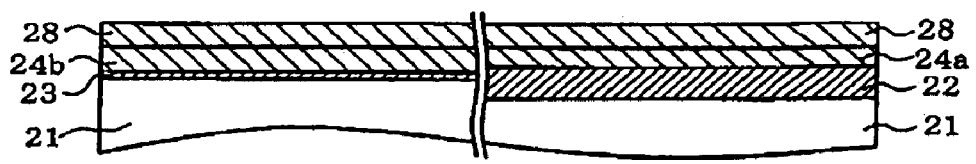
Figures 9G, 9H:
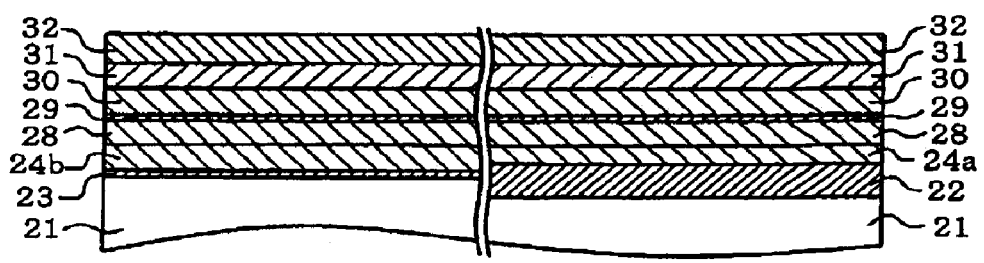
Figures 9I, 9J:
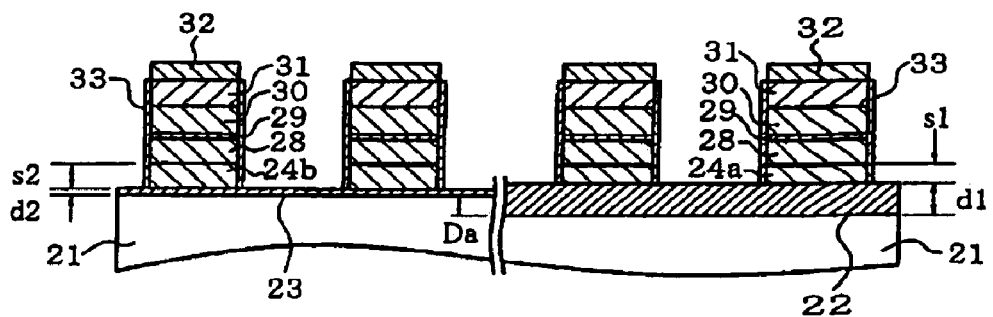

The third silicon oxide film 22 serving as a gate oxide film is formed so as to have a film thickness of 35 nm (film thickness d1) as shown in FIGS. 8K and 8L. Thereafter, the first polycrystalline silicon film 24a with a film thickness of 40 nm (film thickness s1) is deposited on the third silicon oxide film 22, and the second silicon nitride film 42 with a film thickness of 90 nm is also deposited on the first polycrystalline silicon film 24a. The photoresist 43 is processed into a desired pattern by the normal photolithography process as shown in FIGS. 8M and 8N.

Subsequently, the second silicon nitride film 42, first polycrystalline silicon film 24a and third silicon oxide film 22 are processed by the RIE process with the patterned photoresist 43 serving as a mask. The substrate 21 is then exposed to $O_2$ plasma so that the photoresist 43 is removed. The substrate 21 is then heated in the atmosphere of moisture at 750° C. so that the fourth silicon oxide film 23 with a film thickness of 8 nm (film thickness d2) is formed, as shown in FIGS. 8Q and 8R. The second polycrystalline silicon film 24b with a film thickness of 45 nm (film thickness s2) is deposited on the fourth silicon oxide film 23. The third silicon nitride film 44 with a film thickness of 90 nm is deposited on the second polycrystalline silicon film 24b. The photoresist 45 is processed into a predetermined pattern by the normal photolithography process.

Subsequently, the third silicon nitride film 44 is etched with the patterned photoresist 45 serving as a mask as shown in FIGS. 8S and 8T. Successively, the second polycrystalline silicon film 24b is also etched and the substrate 21 is exposed to $O_2$ plasma so that the photoresist 45 is removed. A fifth silicon oxide film 46 with a film thickness of 230 nm is deposited on the surface of the third silicon nitride film 44. A photoresist 47 is then processed into a predetermined pattern for forming shallow trench isolation (STI) by the normal photolithography process.

The fifth silicon oxide film 46 is etched by the RIE process with the patterned photoresist 47 serving as a mask, as shown in FIGS. 8U, 8V, 9C and 9D. The substrate 21 is then exposed to $O_2$ plasma so that the photoresist 47 is removed. The second and third silicon nitride films 42 and 44 are etched with the fifth silicon oxide film 46 serving as a mask. The first and second polycrystalline silicon films 24a and 24b are then etched with the second and third silicon nitride films 42 and 44 serving as masks.

Furthermore, the third and fourth silicon oxide films 22 and 23 and the substrate 21 are etched with the fifth silicon oxide film 46 serving as a mask, and the trench 25 is formed in the silicon substrate 22. Thereafter, the substrate 21 is heated in the O2 plasma at 1000° C. so that a sixth silicon oxide film 26 with a film thickness of about 6 nm is formed on sidewalls of the trench 25. A seventh silicon oxide film 27 with a film thickness of 550 nm is deposited by the high density plasma (HDP) process.

A seventh silicon oxide film 27 is planarized by the CMP process and then heated in the atmosphere of nitrogen at 900° C. as shown in FIGS. 8W, 8X, 9E and 9F. The substrate 21 is then immersed in a solution of buffered hydrofluoric acid for about 22 seconds. The second and third silicon nitride films 42 and 44 are then removed by phosphating at 150° C. The third polycrystalline silicon film 28 which is phosphated at 150° C. is then deposited by the LPCVD process. The RIE process is carried out with the third polycrystalline silicon film 28 serving as a mask. Consequently, a slit 28a is formed in an upper part of the STI region.

The ONO film 29 is then deposited by the LPCVD process as shown in FIGS. 8Y, 8Z, 9G and 9H. The ONO film 29 includes a silicon oxide film with a film thickness of 5.5 nm, a silicon nitride of 8 nm and a silicon oxide film with a film thickness of 5.3 nm. The fourth polycrystalline silicon film 30 which is phosphated is deposited on the ONO film 29 by the LPCVD process. The WSi film 31 with a film thickness of 70 nm is also deposited on the fourth polycrystalline silicon film 30. The fourth silicon nitride film 32 with a film thickness of 300 nm is deposited on the WSi film 31.

A photoresist is then patterned into a predetermined form by the photolithography process. The fourth silicon nitride film 32 is etched by the RIE process with the patterned photoresist serving as a mask. The substrate 21 is then exposed to $O_2$ plasma so that the photoresist is removed. The WSi film 31 and the fourth polycrystalline film 30 are processed by the RIE process. The ONO film 29, the third polycrystalline silicon film 28, the first and second polycrystalline silicon films 24a and 24b are further processed by the RIE process. Thereafter, the substrate 21 is heated in the $O_2$ atmosphere at 1000° C. so that an eighth silicon oxide film 33 is formed on the sidewalls of the gate electrode. The foregoing fabrication process is a wafer step of flash memory.

According to the foregoing embodiment, when the gate oxide films 22 and 23 having different film thicknesses are formed by the foregoing fabrication steps, the recess 21 is previously formed in the silicon substrate 21 so as to provide a step. Accordingly, when the gate oxide films 22 and 23 are formed, a step due to the difference in the film thicknesses of the silicon films is relaxed. Furthermore, the film thicknesses of the polycrystalline silicon films 24a and 24b are adjusted so that the surfaces of films 24a and 24b can be on a level with each other. Consequently, in the CMP process, the levels of the second silicon nitride films 42 and 44 can be equalized, and the planarity can be improved while a sufficient margin can be ensured.

Furthermore, the recess 21a is formed in the silicon substrate 21 by utilizing the reduction in the level of the surface of the substrate. Consequently, the depth of the recess 21a can be controlled precisely.

The invention should not be limited by the foregoing embodiments. The embodiments may be modified or expanded as follows. Two types of gate oxide films 22 and 23 are employed in each of the embodiments. However, the invention may be applied to a case where three or more gate insulating films with three or more film thicknesses are used.

In each embodiment, the recess 21a is formed in the silicon substrate 21 so that the step of the gate oxide film is removed or relaxed. However, only the film thicknesses of the first polycrystalline silicon films 24a and 24b formed on the substrate may be adjusted so that the difference between the gate oxide films is resolved.

The invention may be applied to non-volatile memories other than the flash memory and semiconductor devices other than the non-volatile memory in both of which gate insulating films with different film thicknesses are formed.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

What is claimed is:

1. A method of fabricating a semiconductor device including a semiconductor substrate having a first and a second region, comprising:
   forming a first recess in the second region of the semiconductor substrate by a reactive ion etching (RIE) process;
   forming a first silicon oxide film in the recess;
   removing the first silicon oxide film so that an inner surface of the first recess and a first upper surface of the semiconductor substrate in the first and the second regions are exposed;
   forming a second silicon oxide film in the first recess so that a second upper surface of the second silicon oxide film protrudes from the first upper surface;
   forming a first polycrystalline silicon film on the second upper surface so that the first upper surface is exposed;
   forming a third silicon oxide film on the first upper surface so that a first height of a third upper surface of the third silicon oxide film is lower than a second height of the second upper surface;
   forming a second polycrystalline silicon film on the third upper surface except the second upper surface so that a fourth upper surface of the first polycrystalline silicon film is flush with a fifth upper surface of the second polycrystalline silicon film;
   forming an insulating film on the first and the second polycrystalline silicon film;
   forming a third polycrystalline silicon film on the insulating film; and
   etching the third polycrystalline silicon film, the insulating film and first polycrystalline silicon film in the second region to form a first gate electrode, and the third polycrystalline silicon film, the insulating film and second polycrystalline silicon film in the first region to form a second gate electrode.

2. The method according to claim 1, further comprising forming a second recess deeper than the first recess and forming an isolation film in the second recess after forming the second polycrystalline silicon film and before forming the insulating film.

3. The method according to claim 1, wherein the insulating film includes a pair of silicon oxide films and a silicon nitride film located between the silicon oxide films.

* * * * *